(12) United States Patent
Toh

(10) Patent No.: US 7,249,338 B2
(45) Date of Patent: Jul. 24, 2007

(54) HIGH SPEED BUS WITH RADIO FREQUENCY MICROSTRIP

(75) Inventor: Tze-Chuen Toh, Vermillion, SD (US)

(73) Assignee: Gateway Inc., Irvine, CA (US)

( * ) Notice: Subject to any disclaimer, the term of this patent is extended or adjusted under 35 U.S.C. 154(b) by 425 days.

(21) Appl. No.: 10/847,507

(22) Filed: May 17, 2004

(65) Prior Publication Data

US 2004/0268287 A1    Dec. 30, 2004

Related U.S. Application Data

(60) Provisional application No. 60/472,217, filed on May 21, 2003.

(51) Int. Cl.
*G06F 17/50* (2006.01)
(52) U.S. Cl. ........................................ 716/15
(58) Field of Classification Search .................... 716/15
See application file for complete search history.

(56) References Cited

U.S. PATENT DOCUMENTS

| 4,894,608 | A |   | 1/1990  | Ulmer, Jr. |
|-----------|---|---|---------|------------|
| 5,051,577 | A |   | 9/1991  | Lutz et al. |
| 5,199,879 | A | * | 4/1993  | Kohn et al. ................... 439/63 |
| 5,481,073 | A | * | 1/1996  | Singer et al. ............... 200/1 R |
| 5,486,754 | A |   | 1/1996  | Cruden et al. |
| 5,811,964 | A |   | 9/1998  | Bosselmann et al. |
| 6,043,648 | A |   | 3/2000  | Menke et al. |
| 6,137,383 | A |   | 10/2000 | De Lillo |
| 6,441,313 | B1|   | 8/2002  | Novak |

FOREIGN PATENT DOCUMENTS

| EP | 1280392 A1 | * | 1/2003 |
| JP | 11168153 A | * | 6/1999 |

\* cited by examiner

*Primary Examiner*—Jack Chiang
*Assistant Examiner*—Brandon Bowers
(74) *Attorney, Agent, or Firm*—Ross F. Hunt, Jr.; Stiles & Harbison PLCC

(57) ABSTRACT

A method for preparing a printed circuit board and an apparatus are provided to decrease losses associated with high speed signal propagation. The printed circuit board has at least two conductive layers separated by an dielectric layer formed of a dielectric material. A conductive path is formed in one of the conductive layers for propagation of the high speed signal. At least a portion of the dielectric layer is removed on both sides of and adjacent to the conductive path. The removed portion extends in the dielectric layer between the conductive layers from one to the other and includes a hole shaped portion and a trough shaped portion. The removed portion does not extend beyond the dielectric layer.

14 Claims, 5 Drawing Sheets

HIGH SPEED BUS WITH RADIO FREQUENCY MICROSTRIP

CROSS REFERENCE TO RELATED APPLICATIONS

The present invention is related to, and claims priority from U.S. Provisional Application Ser. No. 60/472,217, filed May 21, 2003, the contents of which are incorporated herein by reference.

BACKGROUND OF THE INVENTION

1. Field of the Invention

The present invention relates to high frequency signal propagation using printed circuit boards (PCBs). In particular the present invention relates to a PCB with a removal portion of a layer alongside a signal transmission strip such as a microstrip on the PCB in order to reduce signal attenuation along the propagation path of a high frequency signal.

2. Brief Description of the Related Art

As the speed of signals propagating on PCBs made of certain dielectric materials increases, the ability for conventional signal traces to carry such signals is limited. Current manufacturing techniques involve microstrips with dielectric material surrounding the microstrip. The use of dielectric material surrounding the microstrip causes undesirable attenuation of high frequency signals propagating via the microstrip referred to as dielectric loss. It is appreciated by those of ordinary skill in the art that the effective frequency of a central processing unit (CPU) on a PCB is limited by the dielectric loss of the microstrip.

Many systems are available for affecting signal propagation. In U.S. Pat. No. 6,441,313 B1 issued on Aug. 27, 2002 to Novak, a layered circuit board is described where the thickness of a dielectric layer can be reduced to reduce high frequency losses between power and ground planes and signal traces. In U.S. Pat. No. 6,137,383 issued on Oct. 24, 2000 to De Lillo, for example, evanescent mode waveguide filters can be constructed using via holes conductively connected to capacitors to form narrow band filters. De Lillo suffers from the need to engage in complicated plating and processing of via holes to achieve filtering and is effective only to provide a narrow band filter within a limited physical space dedicated to filter construction and thus fails to describe reducing propagation losses due to the dielectric characteristics of, for example, an insulative layer or dielectric layer.

Thus it would be desirable in the art for a simple solution to reducing propagation losses for signals traveling on a microstrip on a PCB. An exemplary solution would be simple to construct and reduce losses over a wide range of high frequencies capable of being generated in a modem high speed processor.

SUMMARY OF THE INVENTION

Accordingly, a method for preparing a printed circuit board and an apparatus are provided to decrease losses associated with a propagation of a high speed signal. An exemplary printed circuit board has at least two conductive layers such as a ground layer and signal layer, separated by an insulative layer or dielectric layer formed of a material such as an FR-4 material having a dielectric value. The conductive layers and the dielectric layer are preferably arranged in respective parallel planes.

In accordance with various exemplary embodiments, at least one conductive path for the propagation of the high speed signal is formed in or on at least one of the conductive layers. At least a portion of the dielectric layer may be removed on both sides of and adjacent to the conductive path. The removed portion extends in the dielectric layer, for example in a direction normal to the direction of the planes associated with the layers, between the conductive layers from the conductive layers where the conductive path is formed to the other conductive layers. The portion removed from the dielectric layer can include one or more hole shaped portions along a length of the conductive path, the removed portion extending entirely through the dielectric layer without extending beyond the dielectric layer. Alternatively, the portion removed from the dielectric layer can include a trough shaped portion removed along a length, for example, on both sides of the conductive path, the removed portion extending entirely through the dielectric layer without extending beyond the dielectric layer.

Further in accordance with various exemplary embodiments an apparatus includes at least one conductive path formed in one of the conductive layers and a removed portion of the dielectric layer located on both sides of and adjacent to the conductive path. The removed portion extends in the dielectric layer between the conductive layers from one of the conductive layers to the other of the conductive layers. As noted above, the removed portion can include one or more hole shaped portions along a length of the conductive path, the removed portion extending entirely through the dielectric layer without extending beyond the dielectric layer. Alternatively, the portion removed from the dielectric layer can include a trough shaped portion removed along a length, for example, on both sides of the conductive path, the removed portion extending entirely through the dielectric layer without extending beyond the dielectric layer.

Thus, in accordance with various exemplary embodiments, the present invention process reduces dielectric loss using current PCB materials an increases manufacturers' abilities to produce computing devices having signal transfer frequencies higher than current standards. High frequency signal transfer capabilities would allow PCB manufacturers to produce PCBs utilizing high frequency CPUs. The present invention further includes a process to manufacture PCBs, or any form of planar electronic circuitry, in a manner which increases the potential range of signal propagation frequencies by minimizing the signal attenuation resulting from the use of certain dielectric materials.

In accordance with various exemplary embodiments, the invention may include, but is not limited to, any exemplary device using high radio frequency (RF) signal transmission. The limit of the high frequency signal transfer of such an exemplary device can be increased by, for example, drilling a series of holes along the side or sides of each high frequency RF microstrip. In some embodiments the holes may be separated or may overlap to form a continuous open cavity. Still other embodiments may use etching technology to create an air cavity along the microstrip without departing from the invention. The reduction, through removal, etching, or the like of the dielectric material along the microstrip reduces dielectric loss allowing propagation higher in frequency than can be achieved with current limits, e.g. without the benefit of the claimed invention.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Accordingly, the present invention in accordance with various exemplary embodiments, is directed to a method and apparatus for reducing losses associated with high speed signal propagation on PCBs having dielectric layering formed from, for example, FR-4 materials.

Figure 1:
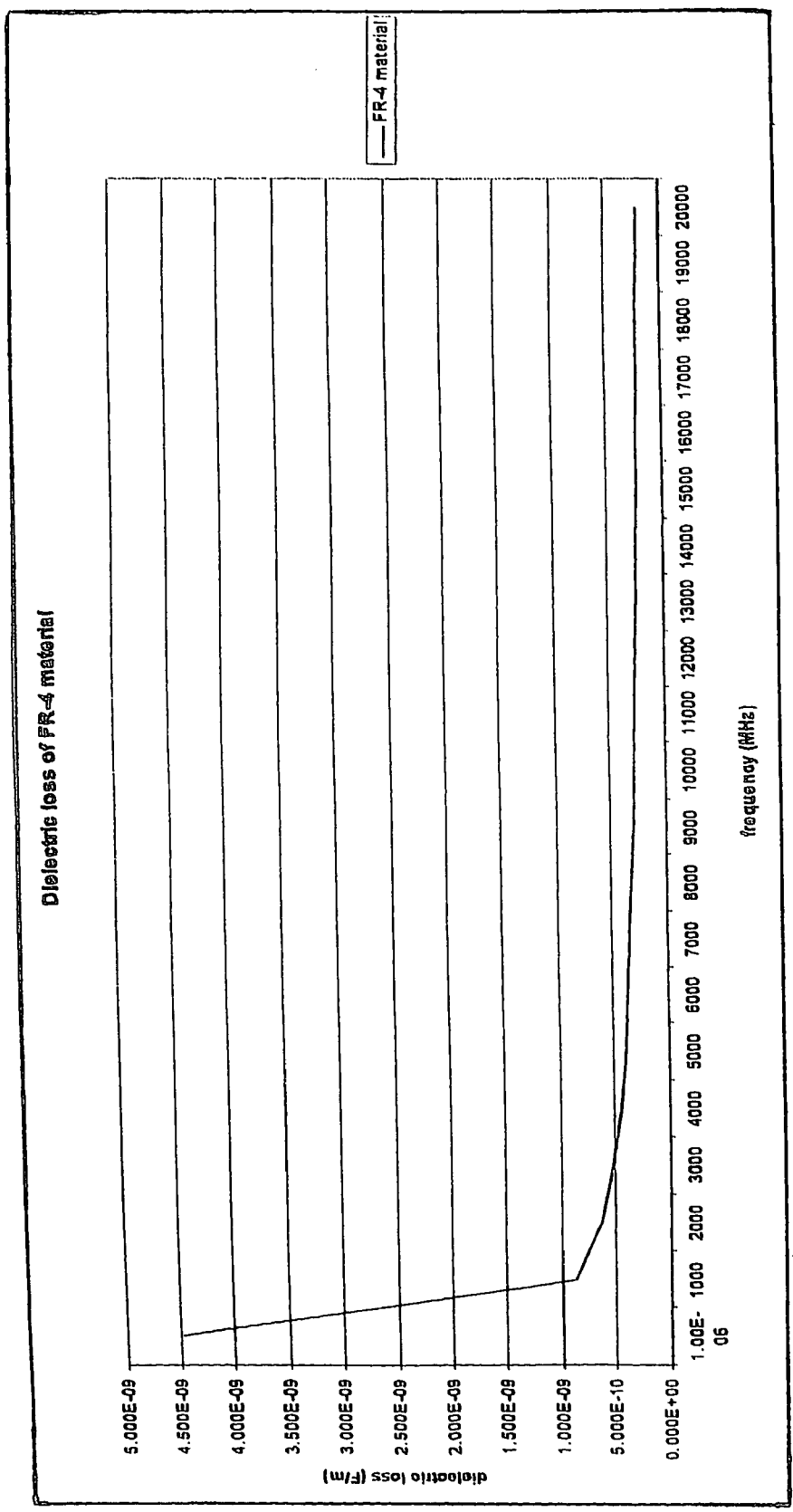
FIG. 1 is a graph illustrating dielectric losses vs. signal frequency associated with an FR-4 material.

The propagation of microwaves in standard FR-4 materials is impractical due to the high dielectric loss, or loss tangent, in the FR-4. FIG. 1 is a graph showing an exemplary relationship 100. Graph 101 shows a plot 102 of losses 120 in FR-4 as a function of frequency 110. As frequency 110 increases toward the right of graph 101 plot 102 shows that losses 120 increase dramatically up to around 1.25 GHz and leveling but remaining severe thereafter. Since high frequency signals in modern processors are now routine, the losses demonstrated in FIG. 1 are troublesome even at relatively low to average signal frequencies.

Figure 2:
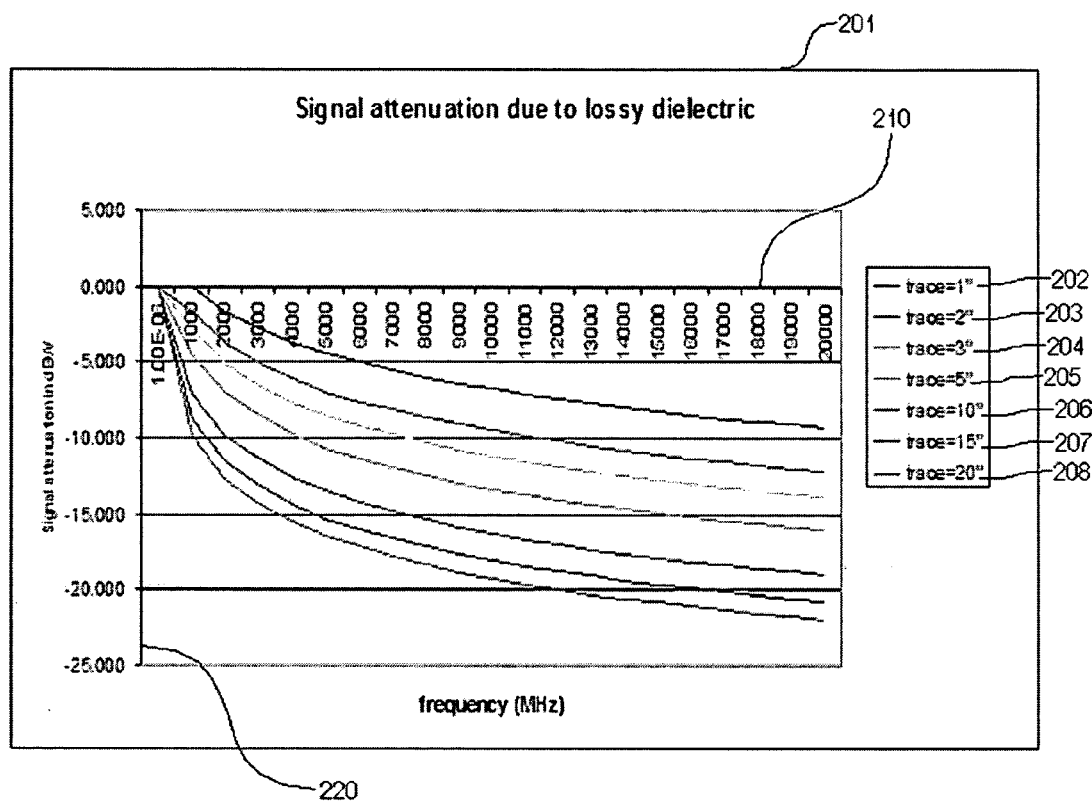
FIG. 2 is a graph illustrating signal attenuation vs. frequency for a variety of trace lengths.

In accordance with various exemplary embodiments, a standard FR-4 PCB can be modified such that high frequency RF waves, e.g. frequencies near 1 GHz and much greater, can propagate on the PCB without suffering significant signal degradation. In particular, an exemplary PCB can support CPU speeds of well over 10 GHz and corresponding high speed buses with signal frequencies of over 1 GHz. As clock frequencies for commercial processors get higher and higher, the propagation of signals on FR-4 PCBs become problematic due to dielectric losses. Signals propagating at high frequencies become attenuated to the point where very little useful information is contained. FIG. 2 illustrates exemplary scenario 200 where graph 201 shows attenuation 220 in dB, versus frequency 210, for a number of trace lengths 202–208 from 1" to 20". It can be seen that as traces become longer the degree of loss rises dramatically for a conventional FR-4 PCB.

Thus FR-4 PCBs in accordance with the present invention may be modified or manufactured to accommodate increasingly higher bus speeds by minimizing signal attenuation resulting directly from dielectric characteristics of the FR-4 material. Standard FR-4 PCBs may thus be configured to accommodate CPUs running above 10 GHz. Since FR-4 is a widely available standard material used for PCB construction, PCB manufacturers can still use FR-4 to build system boards without resorting to high cost, low dielectric loss materials. Further as noted above, while the present disclosure contains references to FR-4, the present invention may be practiced using any commercially viable dielectric material and is thus not limited to FR-4.

Figure 3:
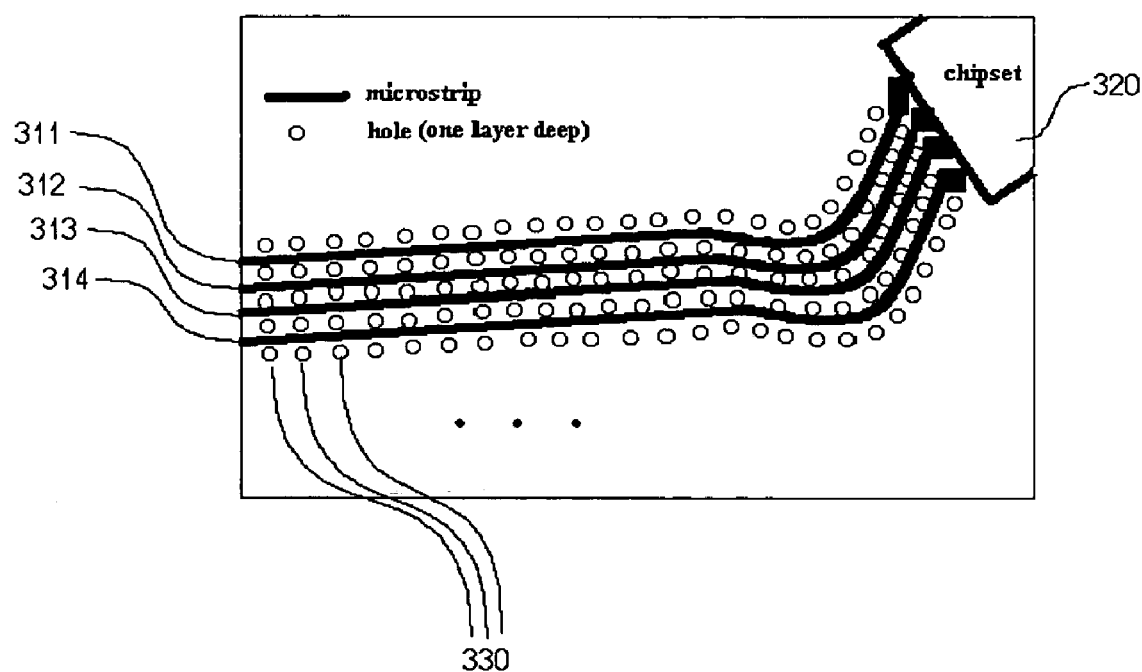
FIG. 3 is a diagram illustrating an exemplary printed circuit board (PCB) having conductive paths and an exemplary pattern of removal in accordance with various exemplary embodiments.

In accordance with various exemplary embodiments, the present invention can be implemented in a very simple manner as illustrated in FIG. 3 where an exemplary scenario 300 is shown. Along each of high frequency RF microstrips 311–314, uniform holes 330 may be drilled or otherwise removed immediately along both sides of each of microstrips 311–314. It should be noted that removal can be performed even when microstrips 311–314 are spaced very close to one another. Removal involves removing material such as FR-4 material from the dielectric layer beneath microstrips 311–314.

In accordance with various exemplary embodiments, holes 330 are preferably of a fixed diameter. Holes 330 are preferably separated by a distance no greater than the diameter. If increased significantly, the diameter of holes 330 may overlap to form a long contiguous cavity and in accordance with various alternative exemplary embodiments, a long contiguous cavity may be milled or otherwise removed in a manner know to those of ordinary skill. In either case, whether holes or a cavity is drilled, milled or other wise removed, care must be taken not to penetrate ground, power or other conductive layers between which the dielectric layer is located. It is important to note that holes cavities or the like removed from the dielectric layer are to be one layer deep only, e.g. the base of holes 330 reaches just to a point before a surface of the immediately adjacent ground or power plane as will be described in greater detail herein after. Holes 330 or alternatively the cavity described above preferably run uniformly along microstrips 311–314 and alongside any surface components located thereon.

It should be noted that removal of material as described above is most applicable to top and bottom layers of a multi-layered PCB since it would be commercially unfeasible to remove material from the inner layers of the PCB. Even if feasible, for example during PCB manufacturing, removing material from inner layers of the PCB would render the PCB extremely fragile.

In accordance with another exemplary embodiment, a thin strip of dielectric separating high frequency RF traces may be removed so that the traces are separated by air rather than by the dielectric. Thus, instead of drilling uniform holes 330 as described above, a layer of dielectric, no deeper than the thickness of the dielectric layer between immediately adjacent power and ground planes, between high frequency RF traces on the top or bottom layer of a multi-layer board is removed. The result is a trace separated by troughs no more than one layer of dielectric deep. Removing dielectric in accordance with such a method would afford an even lower propagation loss than, for example, drilling uniform holes 330 since each trough or trench is essentially a single uniform hole separating, for example, microstrips 311–314. It will be appreciated that the removal of dielectric material as described would not physically weaken the PCB significantly since removal in accordance with various exemplary embodiments would only be carried out along high frequency RF conducting microstrips 311–314, e.g. in the microwave region.

Figure 4:
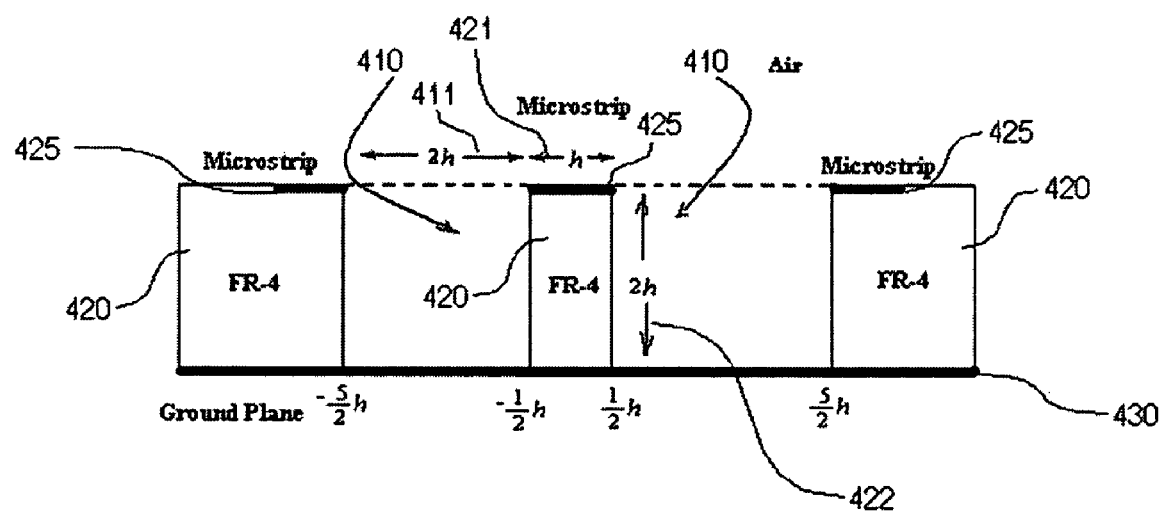
FIG. 4 is a cross section of an exemplary layer of a PCB with exemplary removal regions in accordance with various exemplary embodiments.

To better understand achieving reduced losses associated with high frequency signal propagation in accordance with various exemplary embodiments, a theoretical and quantitative description follows in connection with exemplary scenario 400 shown in FIG. 4 illustrating a cross section of an exemplary PCB. It will be appreciated that simplifying assumptions will be made in connection with the theoretical model for computational purposes. Thus, an exemplary model preferably consists of a microstrip 425 above ground plane 430 separated by dielectric layer 420 preferably made of FR-4. Width h 421 denotes the width of microstrip 425 looking, for example, in the direction of wave propagation. Further in accordance with simplifying assumptions, microstrip 425 is assumed to be a rectangular metallic strip preferably made from Copper (Cu) whose faces are perfectly flat and smooth. Ground plane 430 consists of a smooth, flat, copper plane. The longitudinal component of the electric field (the TM mode) induced via the finite conductivity of the Cu strip will be ignored. Thus, only Transverse Electro Magnetic (TEM) wave propagation along the trace will be assumed—i.e., the dominant mode of propagation along the trace is TEM.

For further computational simplicity, the physical dimensions are as indicated in FIG. 4. That is, height 422 of the top/bottom layer of the dielectric is twice the width 421 of microstrip 425, and removal portions 410 between traces have width 411 which is twice the width of microstrip 425. Time-harmonic fields will be assumed without any loss of generality. That is, the electric field and hence magnetic field will be of the form $A(x, y, z)e^{i\omega t}$, where $i=\sqrt{-1}$ and $\omega=2\pi f$ is the angular frequency of the microwave signal. Finally, it will be assumed that the dielectric temperature is at room temperature, despite the reality that the operating PCB temperature within a chassis is typically higher than room temperature and the electric permittivity varies with temperature as described in Böttcher, C. J. F., "Theory of electric polarization", Elsevier Pub. Co., Amsterdam, (1952).

A thorough analysis of microwave propagation along microstrip 425 can be done in full generality, involving non-uniformity on the surfaces of microstrip 425 and the ground plane 430. However, such rigor is unnecessary for the present discussion.

With the assumptions made above, it will be shown that a significant power loss will be experienced in dBW if the FR-4 between the microstrips 425 carrying high frequency signals is not removed. Let us assume that microstrip 425 and ground plane 430 form a transmission line which satisfies the Laplace equation subject to appropriate boundary conditions. That is, $$\nabla^2 \varphi(x, y) = 0 \text{ subject to } \varphi = \begin{cases} V_0 & \text{for } (x, y) \in M, \\ 0 & \text{for } (x, y) \in G, \end{cases} \quad (2.1)$$

where $\phi$ is the potential function, M is the surface of the microstrip 425 and G is ground plane 430. The wave is assumed to propagate along the z-axis. The potential function for an arbitrary solid trace such as microstrip 425 which is smooth in the direction of wave propagation and of a uniform cross section parallel to smooth ground plane 430 is given by Equation 2.2:

$$\varphi(x, y) = -\frac{V_0}{4\pi} \int_0^1 d\tau \dot{\gamma}(t) \partial_n g(x, y; \gamma(t)), \quad (2.2)$$

where $V_0$ is the voltage of the signal, $$g(x, y; \gamma) = \frac{1}{\sqrt{(x - x_\gamma(t))^2 + (y - y_\gamma(t))^2}} - \frac{1}{\sqrt{(x + x_\gamma(t))^2 + (y - y_\gamma(t))^2}}$$

is the Green's function for the Laplace equation, $(x_\gamma(t), y_\gamma(t)) \in M$ for each $t \in [0,1]$, and n is the unit vector normal to the surface of the conductor.

Figure 5:
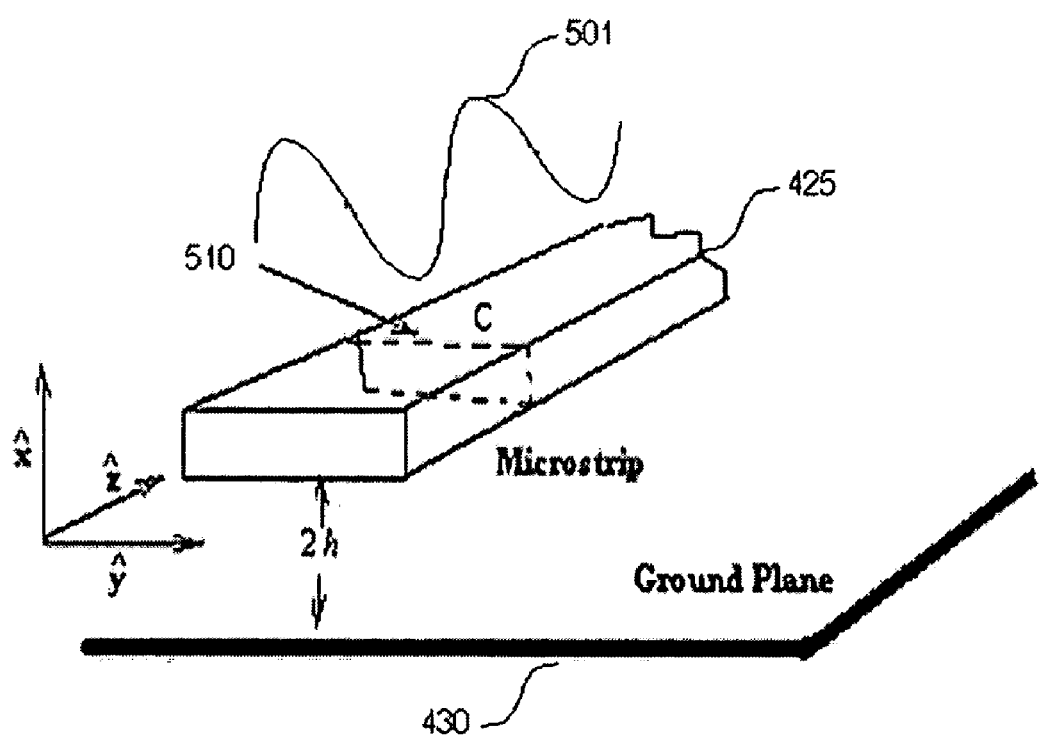
FIG. 5 is three dimensional cross section showing a relationship between an exemplary microstrip, a surface loop C, and a conductive layer of an exemplary PCB in accordance with various exemplary embodiments.

With reference now to FIG. 5 exemplary scenario 500 shows a three dimensional cross section including microstrip 425 and ground plane 430. In equation (2.2), $\gamma=\gamma(t)$, $t \in [0,1]$ can be view as loop 510 defining the boundary of a cross sectional area of microstrip 425 oriented in a direction normal to the direction of propagation of high speed signal 501, e.g. the z-axis. So, $\partial_n g = \nabla g \cdot n$, where $$n = \frac{\nabla \gamma(t)}{\|\nabla \gamma(t)\|}$$

is the unit normal to the surface of microstrip 425 and $\nabla = (\partial_x, \partial_y)$, where $\gamma = C(t)$ is loop 510 denoted by C. The electric field is then given trivially by $$E(x,y,z) = (E_x(x,y)), E_y(x,y))e^{-\alpha z} e^{i\omega t} = -(\partial_x \phi, \partial_y \phi) e^{-\alpha z} e^{i\omega t} \quad (2.3)$$

where $$\alpha = \frac{1}{\sqrt{2}} \left\{ \sqrt{(\omega^2 \mu_0 \varepsilon')^2 + (\omega \mu_0 \sigma + \omega \varepsilon'')^2} - \omega^2 \mu_0 \varepsilon' \right\}^{\frac{1}{2}}$$

is the attenuation coefficient, $$\mu_0 = 4\pi \times 10^{-7} \frac{H}{m}$$

is the permeability of air/vacuum, $\sigma$ is the conductivity of FR-4, $\epsilon = \epsilon'(\omega) - i\epsilon''(\omega)$ is the electric permittivity (dielectric "constant") of FR-4. Using a simple harmonic motion model for atoms and molecules, it can be shown as further described in Böttcher, C. J. F., id., Jackson, John D., "Classical electrodynamics", John-Wiley & Sons, NY (1998), Neff, Herbert P. Jr., "Basic electromagnetic fields", Harper & Row, NY (1981), that $$\varepsilon = \varepsilon_0 + \frac{Ne^2}{m} \sum_j \frac{f_j}{\omega_j^2 - \omega^2 + i\omega\gamma_j},$$

where N is the total number of electrons, $f_j$ is the oscillator strength and it is equal to the number of electrons having resonant (or bonding) angular frequency of $\omega_j$ and damping constant $\gamma_j$. From a computational perspective, the permit tivity is more useful when expressed in terms of relaxation times of FR-4.

$$\varepsilon'(\omega) = \varepsilon_0\varepsilon_\infty + \varepsilon_0\delta\varepsilon \int_0^\infty \frac{G(\tau)d\tau}{1+\omega^2\tau^2}, \quad (2.4)$$

$$\varepsilon''(\omega) = \omega\varepsilon_0\delta\varepsilon \int_0^\infty \frac{G(\tau)\tau d\tau}{1+\omega^2\tau^2}, \quad (2.5)$$

where $\delta\varepsilon$ is determined empirically and depends on the dielectric used. Typically, the values may range anywhere from 1 to 20 or more. Here, $\delta\varepsilon=5$ will be taken. The value $\varepsilon_\infty$ is also determined empirically.

The distribution function $G(\tau)$ is assumed to be Gaussian:

$$G(\tau)d\tau = \frac{b}{\sqrt{\pi}}e^{-b^2y^2}dy, \quad (2.6)$$

where b is a constant, $$y = \ln\frac{\tau}{\tau_0}$$

and (by definition), $$\int_0^\infty G(\tau)d\tau = 1.$$

The relaxation time constant $\tau_0$ is found via equation (2.4) by assuming that (a) $\varepsilon'=4.5\varepsilon_0$ at f=10 MHz, (b) $\varepsilon'=4.17\varepsilon_0$ at f=1 GHz. It has been shown in some conventional literature that at 1 GHz, the dielectric constant of FR-4 drops to around 4.2 further empirical claims have been made that, due to the dielectric loss of FR-4, CPUs above 10 GHz cannot be implemented on conventional FR-4 PCBs. The present invention obviates these findings. Noting that $$\int \frac{G(\tau)}{1+\omega^2\tau^2}d\tau \leq \int \frac{G(\tau)}{\omega^{3/2}\tau^{3/2}}d\tau \quad (2.5)$$

for $\omega \geq 0$. For $\omega$ having a large value, to obtain an estimate for equation (2.4), it will suffice to postulate that $$\varepsilon'(\omega) \approx \varepsilon_0\varepsilon_\infty + \varepsilon_0\delta\varepsilon \int_0^\infty \frac{G(\tau)d\tau}{\omega^{3/2}\tau^{3/2}}. \quad (2.4a)$$

From this, $\tau_0=3.4723\times10^{-8}$s and $\varepsilon_\infty=4.1897$. The conductivity of the dielectric is taken to be $\sigma=10^{-6}$ mhos. Finally, the magnetic permeability of the dielectric is assumed to be lossless and equal to that of free space.

Using a value of b=0.3 will in the computation, with these values for FR-4, plot 106 in FIG. 1 of the dielectric loss $\varepsilon''$ as a function of frequency is shown. The values for small $\omega>0$, that is, for $$\omega \leq \frac{1}{\tau_0} \approx 28.8 \text{ MHz},$$

equation (2.5) reduces to $$\varepsilon''(\omega) \approx \omega\varepsilon_0\delta\varepsilon \int_0^\infty G(\tau)\tau d\tau. \quad (2.5a)$$

The interpolation from f=1 Hz (using equation (2.5a)) to f=1 GHz (using equation (2.4a)), is just a linear interpolation.

Thus if we let P denote the transmitted power along microstrip 425 in the absence of holes 330 or troughs drilled or otherwise removed along each side thereof, and let $P_0$ denote the power transmitted when a thin volume of dielectric, e.g. 1-layer thick, is removed on each side of microstrip 425.

$$P = \iiint \text{Re}(E \times H^*)dV = \int_0^z d\bar{z} \iint dxdy \text{Re}(E \times H^*), \quad (2.7)$$

$$H^* = -\frac{i\gamma^*}{\omega\mu_0}e^{-\gamma^*z}e^{-i\omega t}(\partial_y\varphi, -\partial_x\varphi) \quad (2.8)$$

is the complex conjugate of the magnetic field intensity H, $$\text{Re}(E \times H^*) = \frac{\beta}{\omega\mu_0}e^{-2\alpha z}((\partial_x\varphi)^2(\partial_y\varphi)^2), \quad (2.9)$$

$$(\partial_x\varphi)^2 + (\partial_y\varphi)^2 = \left(\frac{V_0}{4\pi}\right)^2 \gamma \&(\xi)^2 \left\{\partial_x\gamma(\xi)^2 \left(\left(\frac{1}{((x-x_\xi)^2+(y-y_\xi)^2)^{3/2}} - \frac{1}{((x+x_\xi)^2+(y-y_\xi)^2)^{3/2}} + \frac{3(x-x_\xi)^2}{((x-x_\xi)^2+(y-y_\xi)^2)^{5/2}} - \frac{3(x+x_\xi)^2}{((x+x_\xi)^2+(y-y_\xi)^2)^{5/2}}\right)^2 + (y-y_\xi)^2\left(\frac{x-x_\xi}{((x-x_\xi)^2+(y-y_\xi)^2)^{5/2}} - \frac{x+x_\xi}{((x+x_\xi)^2+(y-y_\xi)^2)^{5/2}}\right)^2 + 2\partial_x\varphi(\xi)\partial_y\varphi(\xi)(y-y_\xi)\left(\frac{x-x_\xi}{((x-x_\xi)^2+(y-y_\xi)^2)^{5/2}} - \frac{x+x_\xi}{((x+x_\xi)^2+(y-y_\xi)^2)^{5/2}}\right) \times \left(\frac{1}{((x-x_\xi)^2+(y-y_\xi)^2)^{3/2}} - \frac{1}{((x+x_\xi)^2+(y-y_\xi)^2)^{3/2}}\right) + \partial_y\gamma(\xi)^2\left(\left(\frac{1}{((x+x_\xi)^2+(y-y_\xi)^2)^{3/2}} - \frac{1}{((x-x_\xi)^2+(y-y_\xi)^2)^{3/2}} + \frac{3(y-y_\xi)^2}{((x-x_\xi)^2+(y-y_\xi)^2)^{5/2}} - \frac{3(y-y_\xi)^2}{((x+x_\xi)^2+(y-y_\xi)^2)^{5/2}}\right)^2 + (y-y_\xi)^2\left(\frac{x-x_\xi}{((x-x_\xi)^2+(y-y_\xi)^2)^{5/2}} - \frac{x+x_\xi}{((x+x_\xi)^2+(y-y_\xi)^2)^{5/2}}\right)^2\right)\right\} \quad (2.10)$$

where $0<\xi<1$ (using the mean value theorem for integrals), $(x_\xi, y_\xi)=\gamma(\xi)$ is a point on the surface of microstrip 425, and $$\beta = \frac{1}{\sqrt{2}}\left\{\sqrt{(\omega^2\mu_0\varepsilon')^2 + (\omega\mu_0\sigma + \omega\varepsilon'')^2} + \omega^2\mu_0\varepsilon'\right\}^{1/2}. \quad (2.11)$$

Now, the ratio $$\frac{P}{P_0}$$

shows how much power is lost due to the dielectric absorption of FR-4 as the microwave signal propagates along microstrip 425. Hence, $$N = 10\log\frac{P}{P_0} \quad (\text{dB}W), \quad (2.12)$$

determines how much power is gained without removing the 1-layer strips of dielectric along each side of a high frequency conducting microstrip 425. Note: the gain is negative, indicating a power loss. The losses due to the finite conductivity of the Cu trace will be ignored for simplicity. Solving for P, $P_0$ for the physical dimensions given in FIG. 2 will yield:

$$\frac{P}{P_0} = \frac{3.391\frac{\beta}{\alpha}(1-e^{-2\alpha z})}{1.536\frac{\beta_0}{\alpha_0}(1-e^{-2\alpha_0 z}) + 1.855\frac{\beta}{\alpha}(1-e^{-2\alpha z})}, \quad (2.13)$$

where $\alpha_0, \beta_0$ are, respectively, $\alpha, \beta$ when $\varepsilon''\equiv 0$ for all frequencies. That is, they correspond to air/free space values.

The graph 201 in FIG. 2 shows exemplary plot of equation (2.12) as a function of frequency in MHz. Each curve 202–208 represents a trace of a different length, where the lengths are respectively, 1, 2, 3, 5, 10, 15 and 20 inches. The attenuation for signals (in dBW) without the strips of dielectric removed can easily be seen to increase as the frequency increases. Clearly, the longer the trace, the greater the loss. The frequencies of interest are above 2 GHz. Since some claims have been made that CPUs above 10 GHz cannot be used on conventional PCB's, the above theoretical data shows that in accordance with various exemplary embodiments, CPUs well above 10 GHz can still be used on conventional PCB's. It should be noted that the plot in FIG. 2 only shows up to 20 GHz in increments of 1 GHz. As noted above, while FR-4 was used for illustrative purposes herein, the invention can be applied with similar results to any dielectric material.

Thus by removing portions of dielectric no deeper than 1 layer of a multilayered PCB immediately adjacent to each high frequency carrying microstrip 425, significantly high frequency signals can be propagated along microstrips 425 on conventional PCBs without the need for more expensive dielectric materials. More importantly, existing technologies for building PCBs can be used without involving retooling for a different dielectric material and/or technology thought to be required for high frequency RF propagation.

It is believed that the method of the present invention and many of its attendant advantages will be understood by the forgoing description. It is also believed that it will be apparent that various changes may be made in the form, construction and arrangement of the processes and steps associated therewith without departing from the scope and spirit of the invention or without sacrificing all of its material advantages. The form herein before described being merely an explanatory embodiment thereof. It is the intention of the following claims to encompass and include such changes.

What is claimed is:

1. A method for preparing a printed circuit board to decrease losses associated with a propagation of a high speed signal thereon, the printed circuit board having at least two conductive layers, separated by a dielectric layer formed of a material having a dielectric value, the at least two conductive layers and the dielectric layer being arranged in respective parallel planes, the method comprising: forming at least one conductive path for the propagation of the high speed signal in at least one of the at least two conductive layers; and removing at least one portion of the dielectric layer on both sides of and adjacent to the at least one conductive path, the at least one portion so removed extending in the dielectric layer between the at least two conductive layers from the at least one of the at least two conductive layers to the other of the at least two conductive layers.

2. The method according to claim 1, wherein one at least the portion removed from the dielectric layer includes one or more hole shaped portions along a length of the at least one conductive path, the one or more hole shaped portions removed from the dielectric layer without extending beyond the dielectric layer.

3. The method according to claim 2, wherein the dielectric layer includes an FR-4 dielectric material.

4. The method according to claim 1, wherein the at least one portion removed from the dielectric layer includes a trough shaped portion along a length of the at least one conductive path, the trough shaped portion being removed from the dielectric layer without extending beyond the dielectric layer.

5. The method according to claim 4, wherein the dielectric layer includes an FR-4 dielectric material.

6. The method according to claim 1, wherein the at least two conductive layers include two of a ground plane, a power plane, and a signal plane.

7. The method according to claim 1, wherein the dielectric layer includes an FR-4 dielectric material.

8. An apparatus for decreasing losses associated with a propagation of a high speed signal on a printed circuit board having at least two conductive layers, separated by a dielectric layer, the printed circuit board formed of a material having a dielectric value, the at least two conductive layers and the dielectric layer arranged in respective parallel planes, the apparatus comprising: at least one conductive path formed in at least one of the at least two conductive layers; and a removed portion of the dielectric layer, the removed portion being located on both sides of and adjacent to the at least one conductive path, and the removed portion extending in the dielectric layer between the at least two conductive layers from the at least one of the at least two conductive layers to the other of the at least two conductive layers.

9. The apparatus according to claim 8, wherein the removed portion includes one or more hole shaped portions along a length of the at least one conductive path, the one or more hole shaped portions removed from the dielectric layer without extending beyond the dielectric layer.

10. The method according to claim 9, wherein the dielectric layer includes an FR-4 dielectric material.

11. The apparatus according to claim 8, wherein the removed portion includes a trough shaped portion along a length of the at least one conductive path, the trough shaped portion removed from the dielectric layer without extending beyond the dielectric layer.

12. The method according to claim 11, wherein the dielectric layer includes an FR-4 dielectric material.

13. The method according to claim 8, wherein the at least two conductive layers include two of a ground plane, a power plane, and a signal plane.

14. The method according to claim 8, wherein the dielectric layer includes an FR-4 dielectric material.

* * * * *